US010215802B2

(12) United States Patent
Neff et al.

(10) Patent No.: US 10,215,802 B2
(45) Date of Patent: Feb. 26, 2019

(54) MAGNETICALLY-LATCHED ACTUATOR

(71) Applicant: Systems, Machines, Automation Components Corporation, Carlsbad, CA (US)

(72) Inventors: Edward A. Neff, Cardiff-by-the-Sea, CA (US); Toan M. Vu, San Diego, CA (US)

(73) Assignee: SYSTEMS, MACHINES, AUTOMATION COMPONENTS CORPORATION

( * ) Notice: Subject to any disclaimer, the term of this patent is extended or adjusted under 35 U.S.C. 154(b) by 8 days.

(21) Appl. No.: 15/275,164

(22) Filed: Sep. 23, 2016

(65) Prior Publication Data
US 2017/0089976 A1 Mar. 30, 2017

Related U.S. Application Data

(60) Provisional application No. 62/232,221, filed on Sep. 24, 2015.

(51) Int. Cl.
*G01R 31/28* (2006.01)
(52) U.S. Cl.
CPC .............................. *G01R 31/2891* (2013.01)
(58) Field of Classification Search
CPC .................................................. G01R 31/2891
See application file for complete search history.

(56) References Cited

U.S. PATENT DOCUMENTS 3,602,749 A  8/1971  Esters
4,488,242 A  12/1984  Tabata et al.
(Continued)

FOREIGN PATENT DOCUMENTS

DE     2217958 A1    10/1973
EP     0556469 A1     8/1993
(Continued)

OTHER PUBLICATIONS

International Search Report for International Application No. PCT/US2013/047727, dated Oct. 16, 2013, 3 pages.
(Continued)

*Primary Examiner* — Walter L Lindsay, Jr.
*Assistant Examiner* — Milton Gonzalez
(74) *Attorney, Agent, or Firm* — Cooley LLP

(57) ABSTRACT

A system, apparatus, and method for using a magnetic latch to maintain a desired force between a test-probe assembly and a surface of a component. The method includes moving the test-probe assembly into an approach position, the approach position being a predetermined distance from the surface of a component. The test-probe assembly is then moved from the approach position to the surface of a component pursuant to a soft landing procedure. The method further includes magnetically latching the test-probe assembly in contact with the surface of a component at a constant force. The moving coil of the actuator can be de-energized while the test-probe assembly performs measurements on the component. After the testing is completed, the moving coil is energized and the test-probe assembly is retracted away from the component. The applied force may be monitored based upon an output of a load cell responsive to a force exerted by the test-probe assembly.

20 Claims, 5 Drawing Sheets

(56) References Cited

U.S. PATENT DOCUMENTS

| | | | |
|---|---|---|---|
| 4,576,421 A | 3/1986 | Teramachi | |
| 4,616,886 A | 10/1986 | Teramachi | |
| 4,677,375 A * | 6/1987 | Nakaie | G01R 31/2886 |
| | | | 200/1 B |
| 4,693,676 A | 9/1987 | Inaba | |
| 4,745,589 A | 5/1988 | Nomura | |
| 4,799,803 A | 1/1989 | Tanaka | |
| 4,804,913 A | 2/1989 | Shimizu et al. | |
| 4,808,955 A | 2/1989 | Godkin et al. | |
| 4,857,786 A | 8/1989 | Nihei et al. | |
| 4,858,452 A | 8/1989 | Ibrahim | |
| 5,051,635 A | 9/1991 | Kasahara | |
| 5,053,670 A | 10/1991 | Kosugi | |
| 5,111,088 A | 5/1992 | Fujino | |
| 5,160,865 A | 11/1992 | Gururangan | |
| 5,175,456 A | 12/1992 | Neff et al. | |
| 5,201,838 A | 4/1993 | Roudaut | |
| 5,225,725 A | 7/1993 | Shiraki et al. | |
| 5,270,625 A | 12/1993 | Neff | |
| 5,317,222 A | 5/1994 | Neff et al. | |
| 5,349,543 A * | 9/1994 | Buliszyn | B82Y 15/00 |
| | | | 700/195 |
| 5,376,862 A | 12/1994 | Stevens | |
| 5,446,323 A | 8/1995 | Neff et al. | |
| 5,450,050 A | 9/1995 | Ban et al. | |
| 5,476,324 A | 12/1995 | Takei | |
| 5,501,498 A | 3/1996 | Ulrich | |
| 5,594,309 A | 1/1997 | McConnell et al. | |
| 5,685,214 A | 11/1997 | Neff et al. | |
| 5,722,300 A | 3/1998 | Burkhard et al. | |
| 5,751,075 A | 5/1998 | Kwon et al. | |
| 5,834,872 A | 11/1998 | Lamb | |
| 5,859,482 A | 1/1999 | Crowell et al. | |
| 5,893,646 A | 4/1999 | Mizutani et al. | |
| 5,952,589 A * | 9/1999 | Leung | G01B 7/002 |
| | | | 33/558 |
| 6,004,029 A * | 12/1999 | Moslehi | G01J 5/10 |
| | | | 219/390 |
| 6,043,573 A | 3/2000 | Neff et al. | |
| 6,091,167 A | 7/2000 | Vu et al. | |
| 6,118,360 A | 9/2000 | Neff | |
| 6,223,971 B1 | 5/2001 | Sato | |
| 6,227,703 B1 * | 5/2001 | DiMatteo | G01D 11/245 |
| | | | 374/208 |
| 6,290,308 B1 | 9/2001 | Zitzelsberger | |
| 6,439,103 B1 | 8/2002 | Miller | |
| 6,495,935 B1 | 12/2002 | Mishler | |
| 6,741,151 B1 | 5/2004 | Livshitz et al. | |
| 6,848,164 B2 | 2/2005 | Jung | |
| 6,907,651 B1 | 6/2005 | Fisher et al. | |
| 6,997,077 B2 | 2/2006 | Kollmann et al. | |
| 7,053,583 B1 | 5/2006 | Hazelton | |
| 7,168,748 B2 | 1/2007 | Townsend et al. | |
| 7,323,798 B2 | 1/2008 | Hartramph et al. | |
| 7,482,717 B2 | 1/2009 | Hochhalter et al. | |
| 7,517,721 B2 | 4/2009 | Ito et al. | |
| 8,083,278 B2 | 12/2011 | Yuan | |
| 8,415,838 B1 | 4/2013 | Eghbal et al. | |
| 8,498,741 B2 | 7/2013 | Ihrke et al. | |
| 9,375,848 B2 | 6/2016 | Neff et al. | |
| 9,381,649 B2 | 7/2016 | Neff et al. | |
| 9,731,418 B2 | 8/2017 | Neff et al. | |
| 9,748,823 B2 | 8/2017 | Neff et al. | |
| 9,748,824 B2 | 8/2017 | Neff et al. | |
| 2003/0009241 A1 | 1/2003 | Kruger et al. | |
| 2003/0218391 A1 | 11/2003 | Hirata | |
| 2004/0076348 A1 | 4/2004 | Dalessandro et al. | |
| 2004/0227535 A1 | 11/2004 | Kobayashi et al. | |
| 2004/0232800 A1 | 11/2004 | Seguchi et al. | |
| 2005/0211512 A1 | 9/2005 | Fenwick | |
| 2005/0234565 A1 | 10/2005 | Marks et al. | |
| 2005/0253469 A1 | 11/2005 | Hochhalter et al. | |
| 2006/0023980 A1 | 2/2006 | Kato et al. | |
| 2006/0113847 A1 | 6/2006 | Randall et al. | |
| 2008/0048505 A1 | 2/2008 | Moriyama et al. | |
| 2008/0150559 A1 | 6/2008 | Nayak et al. | |
| 2008/0157607 A1 | 7/2008 | Scheich et al. | |
| 2008/0258654 A1 | 10/2008 | Neff | |
| 2009/0040247 A1 | 2/2009 | Cato et al. | |
| 2009/0058198 A1 | 3/2009 | Finkbeiner et al. | |
| 2009/0058201 A1 | 3/2009 | Brennvall | |
| 2009/0058581 A1 | 3/2009 | Neff et al. | |
| 2009/0114052 A1 | 5/2009 | Haniya et al. | |
| 2009/0152960 A1 | 6/2009 | Kimura et al. | |
| 2009/0218894 A1 | 9/2009 | Aso et al. | |
| 2009/0261663 A1 | 10/2009 | Aso et al. | |
| 2009/0278412 A1 | 11/2009 | Kimura et al. | |
| 2009/0309442 A1 | 12/2009 | Qu et al. | |
| 2010/0005918 A1 | 1/2010 | Mizuno et al. | |
| 2010/0133924 A1 | 6/2010 | Neff et al. | |
| 2010/0171378 A1 | 7/2010 | Kim et al. | |
| 2010/0203249 A1 | 8/2010 | Elgimiabi | |
| 2010/0244605 A1 | 9/2010 | Nakano et al. | |
| 2010/0274365 A1 | 10/2010 | Evans et al. | |
| 2011/0068595 A1 | 3/2011 | Ihrke et al. | |
| 2011/0187222 A1 | 8/2011 | Li et al. | |
| 2012/0043832 A1 | 2/2012 | Neff et al. | |
| 2012/0080960 A1 | 4/2012 | Neff et al. | |
| 2012/0206024 A1 | 8/2012 | Yoshida et al. | |
| 2012/0299405 A1 | 11/2012 | Li et al. | |
| 2012/0305092 A1 | 12/2012 | Corso et al. | |
| 2013/0154397 A1 | 6/2013 | Sullivan | |
| 2014/0159407 A1 | 6/2014 | Neff et al. | |
| 2014/0159408 A1 | 6/2014 | Neff et al. | |
| 2014/0159513 A1 | 6/2014 | Neff et al. | |
| 2014/0159514 A1 | 6/2014 | Neff et al. | |
| 2014/0210396 A1 | 7/2014 | Yamanaka et al. | |
| 2014/0317941 A1 | 10/2014 | Patti et al. | |
| 2015/0168483 A1 | 6/2015 | Kim | |
| 2015/0171723 A1 | 6/2015 | Neff et al. | |
| 2015/0279539 A1 * | 10/2015 | Blanding | H01F 7/123 |
| | | | 335/228 |
| 2015/0303785 A1 | 10/2015 | Neff et al. | |
| 2016/0013712 A1 | 1/2016 | Neff et al. | |
| 2016/0184989 A1 | 6/2016 | Neff et al. | |
| 2016/0229064 A1 | 8/2016 | Neff et al. | |
| 2017/0012519 A1 | 1/2017 | Neff et al. | |
| 2017/0014964 A1 | 1/2017 | Neff | |

FOREIGN PATENT DOCUMENTS

| | | |
|---|---|---|
| EP | 1278109 | 1/2003 |
| EP | 1827073 | 8/2007 |
| GB | 645281 A | 10/1950 |
| JP | 61-116964 A2 | 6/1986 |
| JP | 04-181562 | 6/1992 |
| JP | 03-285554 A | 12/1992 |
| JP | 06-260332 | 9/1994 |
| JP | 07-015942 | 1/1995 |
| JP | 07-131967 A | 5/1995 |
| JP | H09-214187 | 8/1997 |
| JP | 2000-152592 A | 5/2000 |
| JP | 2001-238427 A | 8/2001 |
| JP | 2001-286121 A2 | 10/2001 |
| JP | 2002-176292 | 6/2002 |
| JP | 2004-332935 | 11/2004 |
| JP | 2005-020901 A | 1/2005 |
| JP | 2005-080415 | 3/2005 |
| JP | 2008-048556 A | 2/2008 |
| JP | 2008-155302 A2 | 7/2008 |
| JP | 2008-193845 A | 8/2008 |
| JP | 2010-178614 A | 8/2010 |
| KR | 10-2008-0090040 | 10/2008 |
| KR | 20-2011-0003488 | 4/2011 |
| KR | 10-2011-0139434 | 12/2011 |
| WO | WO 2007/026566 A1 | 3/2007 |
| WO | WO 2007/063729 A1 | 6/2007 |
| WO | WO 2009/116343 A1 | 9/2009 |
| WO | WO 2009/117827 | 10/2009 |
| WO | WO 2011/088964 A1 | 7/2011 |
| WO | WO 2014/076809 | 5/2014 |

(56) References Cited

FOREIGN PATENT DOCUMENTS

| WO | WO 2015/117095 | 8/2015 |
|---|---|---|
| WO | WO 2015/154026 | 10/2015 |

OTHER PUBLICATIONS

Written Opinion for International Application No. PCT/US2013/047727, dated Oct. 16, 2013, 4 pages.

International Preliminary Report on Patentability for International Application No. PCT/US2013/047727, dated Dec. 31, 2014, 5 pages.

International Search Report for International Application No. PCT/US2013/047728, dated Oct. 16, 2013, 3 pages.

Written Opinion for International Application No. PCT/US2013/047728, dated Oct. 16, 2013, 6 pages.

International Preliminary Report on Patentability for International Application No. PCT/US2013/047728, dated Dec. 31, 2014, 7 pages.

International Search Report and Written Opinion for International Application No. PCT/US2008/071988, dated Nov. 3, 2008, 5 pages.

International Preliminary Report on Patentability for International Application No. PCT/US2008/071988, dated Feb. 2, 2010, 5 pages.

International Search Report and Written Opinion for International Application No. PCT/US2008/052121, dated Aug. 6, 2008, 5 pages.

International Preliminary Report on Patentability for International Application No. PCT/US2008/052121, dated Jul. 28, 2009, 5 pages.

International Search Report and Written Opinion for International Application No. PCT/US2011/053070, dated Feb. 16, 2012, 6 pages.

International Preliminary Report on Patentability International Application No. PCT/US2011/053070, dated Mar. 26, 2013, 5 pages.

Supplementary European Search Report for European Application No. 14191347.5, dated May 4, 2015, 7 pages.

International Search Report and Written Opinion for International Application No. PCT/US2015/014133, dated Apr. 29, 2015, 8 pages.

International Search Report and Written Opinion for International Application No. PCT/US2015/024341, dated Jul. 15, 2015, 10 pages.

International Preliminary Report on Patentability for International Application No. PCT/US2015/024341, dated Oct. 4, 2016, 8 pages.

International Search Report and Written Opinion for International Application No. PCT/US2015/054314, dated Jan. 22, 2016, 10 pages.

International Search Report and Written Opinion for International Application No. PCT/US2016/014602, dated May 12, 2016, 9 pages.

International Search Report and Written Opinion for International Application PCT/US2016/041793, dated Oct. 3, 2016, 7 pages.

Semiconductor Components Industries, LLC, "DC Motor Driver Fundamentals," Publication Order No. TND6041/D, ON Semiconductor [online], Mar. 2014—Rev. 1, pp. 1-9, www.onsemi.com.

Machine Design, Design FAQs, Variable Wattage Control Systems for Electric Heaters, "Moving coil motor technology," [online], Feb. 26, 2009, [Retrieved from the Internet: Jul. 31, 2015], <URL: httb://machinedesign.com/motion-control/moving-coil-motor-technology>, 1 page.

Thomas Publishing Company, Product News: Mechanical Power Transmission, "Actuator and Ball Spline come in mini and micro sizes," [online], Sep. 3, 2004, [Retrieved from the Internet: Aug. 7, 2015], <URL: http://news.thomasnet.com/fullstory/455177>, 5 pages.

Luna Bearings, Automation & Power Transmission, WON Linear Motion System, "Compact Ball Spline," [online], 2009, [Retrieved from the Internet: Aug. 7, 2015], <URL: http://www.lunabearings.com/won.htm>, 6 pages.

International Search Report and Written Opinion for International Application No. PCT/US2016/053565, dated Dec. 27, 2016, 8 pages.

Dirjish, M., "What's the difference between brush DC and brushless DC motors?", Electronic Design, Feb. 16, 2012, 5 pages.

\* cited by examiner

MAGNETICALLY-LATCHED ACTUATOR

CROSS-REFERENCE TO RELATED APPLICATIONS

The present application claims the benefit of priority under 35 U.S.C. § 119(e) of U.S. Provisional Application Ser. No. 62/232,221, entitled "MAGNETICALLY-LATCHED ACTUATOR," filed Sep. 24, 2015, the content of which is hereby incorporated by reference in its entirety for all purposes.

FIELD

The present disclosure pertains generally to machines which are useful for assembling, testing, or manufacturing a component of an end product. The present disclosure is particularly, but not exclusively, useful for the testing of components that require prolonged contact forces during the measurement process.

BACKGROUND

Linear actuators are mechanical devices which are used to perform repetitive actions requiring linear motion. For example, linear actuators can be used in an assembly plant for placing caps on bottles, for automatically stamping or labeling mail, for glass cutting, for placing chips on circuits, for contacting test-probe assemblies to measure circuits on components, for testing various buttons or touch areas on electronic devices, for automation, and for a wide variety of other purposes as well.

Quality control is important in the manufacture of components that are assembled together to produce an end product. Often, components are manufactured and tested prior to being assembled and before additional value is added within a manufacturing process. Machines such as actuators can be used to inspect, measure, and determine if one or more critical parameters of a component are within tolerances, and if the component operates as specified. For example, a test-probe assembly coupled to the shaft of a moving coil actuator may be used to precisely measure the electronic properties of a component. Sometimes electronic testing can require a prolonged period of time for the measurement to be completed. Depending on the arrangement of the testing equipment and the component, this may in turn require that the moving coil actuator is energized for prolonged period of time. Once the measurements are completed, a determination can be made as to whether the component is operating properly within a tolerance window, or whether the component should be discarded or remanufactured.

SUMMARY

The present disclosure generally pertains to an apparatus with a movable shaft that can be latched in a fixed position and methods of use thereof. In particular, the present disclosure pertains to methods of maintaining the shaft position when the apparatus is de-energized during assembling, testing, or manufacturing of components. The apparatus can be used for the purposes of repeatedly testing individual components by moving a test-probe assembly into prolonged contact with a surface of the component. Because the machine operates to move a first body (the test-probe assembly) into contact with a second body (the surface of a component of an end product), forces are generated against both bodies by this action. It happens that many components incorporate very delicate and fragile electronic parts that can be easily damaged if the contact forces that are generated during measurement are too large. However, the test-probe assembly requires constant physical contact with the component to ensure an accurate test measurement, which requires the apparatus be energized from prolong periods of time. Energizing the machine and maintaining a constant force can produce excessive heat and lead to premature apparatus failure. Consequently, in order to avoid damage to the component and to the machine, it is often desirable that any precise pre-determined forces generated against the specified component be controlled during testing and that the apparatus be energized for only short periods of time during an extended testing process.

Additionally, since the component to be tested can be small and millions of units may need to be quickly tested, the footprint of the testing machine will preferably be kept small. Hence, actuators used to move such components should have an overall size as small possible. However, smaller actuators are not generally capable of producing as large of forces as larger actuators. As a consequence, those actuators of a desired small size will not typically be able to meet the higher force requirements needed when high-contact-density components need to be tested. One solution is a compact actuator that can provide a high short-term, force in the order of 10-20 milliseconds, and could then be turned off while still applying that high force. That is, it would be desirable to provide methods and apparatus for moving a test-probe assembly into controlled contact with a surface of a component and for maintaining a constant contact force between the test-probe assembly and the surface of a component while avoiding premature machine failure.

Methods and apparatus described herein include a magnetic latch to maintain contact by applying a continuous force between a test-probe assembly and a surface of a component. Such methods may involve rapidly moving the test-probe assembly with an actuator to an approach position located a safe distance from the surface of a component. The approach position will typically be selected to be as close as possible to the surface of a component without risking abrupt or forceful contact with the surface. Once the test-probe assembly has been positioned close to, but safely above, the surface of a component, a soft landing procedure may be employed to bring the test-probe assembly in soft contact with the surface of a component.

Once soft contact with a target surface of the component has been established, the shaft of the actuator can be magnetically latched to allow the moving coil actuator to be de-energized. The magnetic latch maintains the constant force between the test-probe assembly and the surface of the component. The applied force may then be monitored by, for example, using a load cell or the like to verify that the applied force at the desired level.

In another aspect the disclosure relates to a method for testing a component using a test-probe assembly coupled to a shaft of an actuator. The method includes energizing the actuator during a first time period to move the test-probe assembly into an approach position. The approach position is a predetermined distance from a surface of the component. The method also includes energizing the actuator during a second time period by performing a soft landing procedure wherein the performing includes moving the test-probe assembly from the approach position and into soft contact with the surface of the component. The method also includes latching the shaft in a fixed position so as to cause the test-probe assembly to apply a constant force to the surface of the component and de-energizing the actuator while maintaining the shaft in the fixed position for a duration of time. The duration of time can be about 1.5 seconds. The constant force applied can be about 3.0 kg-f.

The method can further include determining that the test-probe assembly has made soft contact with the surface of the component. Determining that the test-probe assembly has made soft contact with the surface of the component can include measuring the force applied by the test-probe assembly to the surface component. The force applied by the test-probe assembly to the surface of the component may be measured with a load cell.

The method can further include energizing the actuator to move the test-probe assembly out of contact with the surface of the component. The latching of the test-probe assembly in a fixed position can include engaging a magnetic latch. The energizing of the actuator to move the test-probe assembly out of contact with the surface of the component can include disengaging the magnetic latch.

Another innovative aspect of the subject matter described in this disclosure is implemented in a method for testing a component using a test-probe assembly coupled to a shaft of an actuator. The method includes energizing the actuator to extend the shaft to move the test-probe assembly into contact with a surface of the component and magnetically latching the shaft in a fixed position to maintain a constant force applied by the test-probe assembly to the surface of the component.

The method can also include de-energizing the actuator while maintaining the shaft in the fixed position and measuring the force applied by the test-probe assembly to the surface component. The method can also include energizing the actuator to move the test-probe assembly out of contact with the surface of the component.

Another innovative aspect of the subject matter described in this disclosure is implemented in an apparatus including a linear actuator including a housing, a shaft protruding from an end of the housing, and a moving coil disposed in the housing and coupled to the shaft. The apparatus also includes an adapter coupled to an end of the housing of the linear actuator and configured to allow the shaft to extend and to retract therethrough. The apparatus also includes a ferrous plate adjustably coupled to the shaft and a magnet coupled to the adapter. The magnet is configured to engage with the ferrous plate when the shaft is extended from the housing of the linear actuator to retain the shaft in a fixed position when the moving coil is de-energized.

The apparatus can also include a test-probe assembly coupled to an end of the shaft protruding from the end of the housing. The apparatus can also include a resilience mechanism coupled to the shaft protruding from the end of the housing. The resilience mechanism may be configured to maintain a constant force when the test-probe assembly is in contact with a surface of a component. The resilience mechanism may be interposed between the end of the shaft and the test-probe assembly. The resilience mechanism may comprise a spring or elastomeric material. The test-probe assembly may include a load cell.

The following U.S. published applications are hereby incorporated herein by reference for all purposes:

application Ser. No. 13/927,075 Application Date Jun. 25, 2013 Publication No. US-2014-0159407-A1 Publication Date Jun. 12, 2014 Title ROBOTIC FINGER;

application Ser. No. 13/927,076 Application Date Jun. 25, 2013 Publication No. US-2014-0159408-A1 Publication Date Jun. 12, 2014 Title ROBOTIC FINGER;

Application No. PCT/US2013/047727 Application Date Jun. 25, 2013 Publication No. WO 2014/004588 Publication Date Jan. 3, 2014 Title ROBOTIC FINGER;

application Ser. No. 13/927,079 Application Date Jun. 25, 2013 Publication No. US-2014-0159514-A1 Publication Date Jun. 12, 2014 Title LOW-COST, REDUCED DIAMETER LINEAR ACTUATOR;

application Ser. No. 13/927,078 Application Date Jun. 25, 2013 Publication No. US-2014-0159513-A1 Publication Date Jun. 12, 2014 Title LOW-COST, REDUCED DIAMETER LINEAR ACTUATOR;

Application No. PCT/US2013/047728 Application Date Jun. 25, 2013 Publication No. WO 2014/004589 Publication Date Jan. 3, 2014 Title LOW-COST, REDUCED DIAMETER LINEAR ACTUATOR;

application Ser. No. 12/184,918 Application Date Aug. 1, 2008 Publication No. US 2009-0058581 A1 Publication Date Mar. 5, 2009 Title COMPACT LINEAR ACTUATOR AND METHOD OF MAKING SAME;

Application No. PCT/US2008/071988 Application Date Aug. 1, 2008 Publication No. WO 2009/018540 Publication Date Feb. 5, 2009 Title COMPACT LINEAR ACTUATOR AND METHOD OF MAKING SAME;

application Ser. No. 12/020,466 Application Date Jan. 25, 2008 Publication No. US 2008-0258654 A1 Publication Date Oct. 23, 2008 Title COMBINATION PNEUMATIC AND ELECTRIC LINEAR ACTUATOR;

Application No. PCT/US2008/052121 Application Date Jan. 25, 2008 Publication No. WO 2008/092124 Publication Date Jul. 31, 2008 Title COMBINATION PNEUMATIC AND ELECTRIC LINEAR ACTUATOR;

application Ser. No. 12/188,111 Application Date Aug. 7, 2008 Publication No. US 2009-0040247 A1 Publication Date Feb. 12, 2009 Title MICRO SHIM FOR MOVING COIL ACTUATOR;

application Ser. No. 12/622,372 Application Date Nov. 19, 2009 Publication No. US 2010-0133924 A1 Publication Date Jun. 3, 2010 Title COMPACT LINEAR ACTUATOR AND METHOD OF MAKING SAME;

application Ser. No. 12/860,809 Application Date Aug. 20, 2010 Publication No. US 2012-0043832 A1 Publication Date Feb. 23, 2012 Title COMPACT LINEAR ACTUATOR WITH ROTARY MECHANISM;

application Ser. No. 13/244,156 Application Date Sep. 23, 2011 Publication No. US 2012-0080960 A1 Publication Date Apr. 5, 2012 Title LOW COST MULTI-COIL LINEAR ACTUATOR;

Application No. PCT/US2011/053070 Application Date Sep. 23, 2011 Publication No. WO 2012/040620 Publication Date Mar. 29, 2012 Title LOW COST MULTI-COIL LINEAR ACTUATOR;

Application No. PCT/US2015/014133 Application Date Feb. 2, 2015 Publication No. WO 2015/117095 Publication Date Aug. 6, 2015 Title DIRECT DRIVE MOTOR FOR ROBOTIC FINGER;

application Ser. No. 14/678,717 Application Date Apr. 3, 2015 Publication No. US-2016/0013712-A1 Publication Date Jan. 14, 2016 METHODS AND APPARATUS FOR COMPACT SERIES LINEAR ACTUATORS;

Application No. PCT/US2015/024341 Application Date Apr. 3, 2015 Publication No. WO 2015/154026 Publication Date Oct. 8, 2015 METHODS AND APPARATUS FOR COMPACT SERIES LINEAR ACTUATORS; and Application No. PCT/US2015/054314 Application Date Oct. 6, 2015 Publication No. WO 2016/057570 Publication Date Apr. 14, 2016 METHODS AND APPARATUS FOR CLOSED LOOP FORCE CONTROL IN A LINEAR ACTUATOR.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

Figure 1:
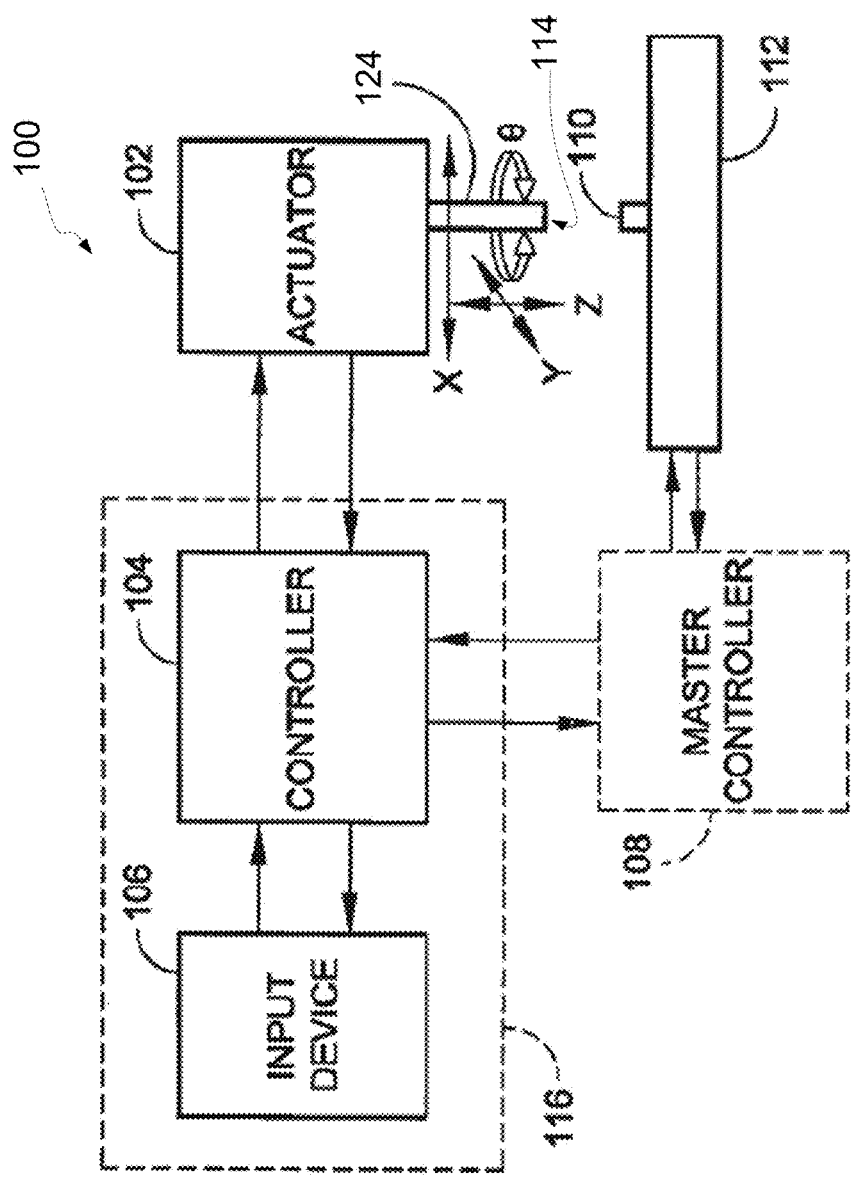
FIG. 1 is a system block diagram of a programmable and automated, actuator-based component inspection system, according to an embodiment.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

FIG. 1 is a system block diagram of a programmable and automated, actuator-based component testing system, according to an embodiment. Referring FIG. 1, the system 100 includes an actuator 102, a controller 104, an input device 106 and a master controller 108. Also shown is a component 110 to be tested, where the component is positioned by a handler 112. The actuator 102 can be any actuator based device, such as a pneumatic, hydraulic or electrical actuator. In preferred embodiments, the actuator 102 is an electrical actuator, such as a moving coil actuator (also known as a voice coil actuator) or a moving magnet actuator. In some embodiments, the actuator is a LCA25 series linear actuator available from SMAC Corporation in Carlsbad, Calif. It is understood that although one actuator 102 is illustrated, the system 100 can be configured to include more than one actuator. In the illustrated embodiment, the actuator 102 includes a shaft 124 that is moveable in at least one axis. For example, depending on the specific actuator used, the shaft 124 may be moved in an x, y and/or z axis relative to the body of the actuator 102. Furthermore, the shaft 124 may be rotational (θ) about one or more of the x, y and/or z axes. It is also noted that although the actuator 102 illustrated shows potentially four axes of actuation, an actuator may be provided that has only one axis of actuation.

A test-probe assembly 114 can be coupled to shaft 124 and can be moved to contact different portions of a component 110. Alternatively, the shaft can move the component into contact with a test-probe assembly that is not mounted to the shaft. Typically, the component 110 is moved into or held in a testing orientation by the handler 112. For example, the handler 112 may be a robotic conveyor or gripper system controlled by the master controller 108 that locates the component 110 at a known reference location relative to the test-probe assembly 114 coupled to shaft 124.

In alternative embodiments, the test-probe assembly in not connected to the shaft of the actuator. The test-probe assembly is coupled in a stationary position above a component, and the actuator is positioned below the component. The actuator can extend a shaft through a hole within a handler to lift the component into contact with the test-probe assembly. After testing is complete, the actuator can retract the shaft to lower the component back onto the handler. The handler can then index, for example in a rotary or linear direction, to position the next component above the actuator.

The actuator 102 can include one or more encoders (not shown) that are capable of taking positional measurements about one or more axes. That is, in response to control signals from the controller 104, the actuator 102 sends measurements from its encoders to the controller 104 to indicate the precise positional location of a test-probe assembly about the relevant axes. In this way the test-probe assembly may be moved to an approach position relatively close to, but safely away from, a target surface of interest. The test-probe assembly 114 is able to perform a "soft-land" operation where the test-probe assembly 114 is brought into contact with a surface of the component 110 so as not to damage the surface of the component 110 and also to establish an accurate contact location. Additional information about the soft-land operation is set forth in U.S. Pat. No. 5,952,589 entitled "Soft Landing Method for test-probe assembly" (the "'589 patent") and U.S. Publication No. 2005/0234565 entitled "Programmable Control System for Automated Actuator Operation", respectively, both of which are hereby incorporated by reference in their entireties for all purposes. As is described below, once the test-probe assembly 114 has established soft contact with the surface of a component, a magnetic latch (not shown) can be used to cause the test-probe assembly 114 to maintain contact and apply a continuous force to the surface of a component of a component while the actuator is de-energized.

As is discussed in the '589 patent, the soft-land procedure typically involves placing the test-probe assembly at an approach position. This approach position can be arbitrarily established in accordance with the desires of the operator, but preferably, the approach position places the test-probe assembly much closer than about one millimeter away from the surface of a component. The approach position will generally be dependent on the characteristics of the surface of a component; namely, the approach position can be made to be closer to smooth target surfaces relative to rougher surfaces without substantially increasing the risk of forceful, inadvertent contact. In any event, the test-probe assembly is placed at the approach position for subsequent movement along a path from the approach position into soft contact with a predetermined point on the surface of a component.

Initially, the test-probe assembly is held stationary at the approach position. Then, the forces which are acting to hold the test-probe assembly stationary are changed in magnitude until the inherent static friction forces that have been acting on the stationary test-probe assembly are overcome. When the static friction forces have been overcome, the system becomes dynamic and the test-probe assembly advances toward the work surface under the influence of the resultant force.

As the test-probe assembly is advanced toward the surface of a component, it is monitored to determine when soft contact is made with the work surface. Specifically, several control modes of operation for determining soft contact are possible. In particular, each of these control modes depends on a measurable parameter that is characteristic of the movement of the test-probe assembly. These measurable parameters include i) the test-probe assembly's travel position on the path toward the work surface (position control mode), ii) its velocity (velocity control mode), and iii) the acceleration/deceleration of the test-probe assembly (torque control mode). In an alternate embodiment, none of the above mentioned measurable parameters are monitored and, instead, the test-probe assembly is allowed to merely advance into soft contact with target surface under the influence of the resultant force (basic mode). The position control mode of operation, velocity control mode of operation and the torque control mode of operation are described in further detail in the '589 patent.

Additionally, the actuator 102 can include one or more load cells (i.e., force sensors) that are capable of measuring forces such as, for example, the force exerted by a test-probe assembly 114 on a target surface about a given axis. In such implementations activation of a load cell may determine when soft contact between the test-probe assembly 114 and the surface of component 110 has been established.

The controller 104 can control the movements of the test-probe assembly 114. For example, the controller 104 can be a servo controller that can operate a moving coil actuator. The master controller 108, if present, controls the larger assembly and inspection system. For example, the master controller 108 can be a part of an inline assembly system that controls the flow or positioning of the component(s) 110 to be inspected by the actuator 102. The master controller can send start/stop signals to the controller 104. In response, the controller 104 controls the inspection process of the actuator 102 and can output data, for example, in the form of measurements or pass/fail results of programmed tolerances. Accordingly, the controller 104 and/or the master controller 108 can determine if the inspected component is acceptable or should be discarded. In some configurations, the controller 104 can be, for example, a Galil DMC31012 controller with built-in amplifier and a 16 bit analog output. In another type of inspection, a switch test can be performed in which the test-probe assembly 114 is moved into position to depress a switch while monitoring the force required to depress the switch and/or to hold it in a depressed position. Such forces may be monitored to determine if the switch is within a specified tolerance window.

As is known, the controller 104, such as a servo controller, can generate control signals that operate the actuator 102. For example, in accordance with programmed instructions, typically in the form of software, the controller 104 can generate control signals and output such control signals to the actuator 102 to cause movement of the test-probe assembly 114 about one or more axes. In one embodiment the controller 104 is programmed to control the actuator 102 depending on the application, i.e., depending on the component to be inspected. For example, the controller 104 includes software that is specifically configured to cause the desired actuator movement and measurement for the specific component to be inspected. Typically, a computer (not shown) is coupled to the controller 104 to generate and transmit software (code representing a set of instructions to be executed) generated in a programming language to the controller for the specific application. Such software, once running on the controller 104, will instruct test-probe assembly 114 movements and measurements for that specific application or component.

Typically, a control system is provided to the controller 104 that includes generic programming instructions that are programmable by a user in a non-programming language to operate the actuator-based component inspection system in an automated fashion. Thus, the controller 104 is provided with programming instructions (such as software generated by a programmer) stored in memory that can allow the user to finalize the programming of inspection controls to the specifics of the given application or component to be inspected, and without necessitating that the user have any knowledge of computer code programming. It is to be noted that these programming instructions are incomplete on their own such that without a motion profile for a specific component 110, the program instructions are unable to execute an inspection routine for that component 110. Advantageously, rather than requiring a skilled software programmer to develop a software program to operate the actuator 102 for the given application (including for all test-probe assembly movements, measurements and tolerance determinations), a generic instruction program is developed and provided that includes a non-programming language user interface that allows the user to input and store all relevant parameters. Such parameters may include, for example, test-probe assembly movements, velocities, time delays, measurements and tolerance measurements that are specific to the application. Advantageously, the code or instructions comprising the program can be the same for different applications, where the user can input parameters defining a motion profile that is used by the programmed instructions to operate the actuator 102 in automated use. As used herein, a motion profile can be referred to as a stored sequential set of test-probe assembly movements and actions (e.g., to cause position measurements) and tolerance values associated with certain measurements which collectively define the operation of the test-probe assembly 114 and measurements taken during an inspection routine. Additionally, in other embodiments, the program instructions can allow the user to program separate motion profiles for separate components that can be stored in the input device 106 or the controller 104. In some instances, motion profiles stored in the input device 106 can be transferred from the input device 106 to other controllers 104 operating other actuators 102.

In other configurations, the control system programming instructions are stored on and executed in part by both the input device 106 and the controller 104. The input device 106 can be any device that can allow the user to input the desired actuator parameters such as, for example, a handheld device (e.g., a handheld pendant), a personal computer, a notebook computer, and/or the like. The input device 106 can be coupled to the controller 104 via, for example, an RS-232, EIA-232, EIA-422 or EIA-485 connection. In other instances, however, the coupling of the input device 106 to the controller 104 can be done via any wired or wireless communication methods to communicate input data to the controller. The input device 106 may be a separate device as illustrated in FIG. 1 or may be physically part of the controller 104 (as indicated by dashed control block 116). For example, the controller 104 may include an integrated user key entry means coupled to the controller body. It is to be noted that the programming instructions stored on and executed by the input device 106 is different than the programming instructions stored on and executed by the controller 104 and collectively facilitates the user's ability to store a variety of motion profiles.

The input device 106 can include a display unit (not shown in FIG. 1) that can be, for example, a liquid crystal display (LCD) unit or a light emitting diode (LED) alphanumeric display unit that displays a graphical user interface (GUI) generated by the control system. The GUI displayed on the display unit can allow a user to interact with the controller 104. The GUI may include a set of displays having message areas, interactive fields, pop-ups, pull-down lists, notification areas, and buttons operated by user. The GUI may include multiple levels of abstraction including groupings and boundaries. It should be noted that the term GUI may be used in the singular or in the plural to describe one or more GUI's, and each of the displays of a particular GUI may provide users of the with an efficient and user-friendly communications and control tool for the controller 104. The programming instructions or code (implemented as software and/or firmware) of the control system are configured to receive a variety of user input parameters via the input device 106 to establish and store an automated routine or motion profile for automated execution.

Figure 2:
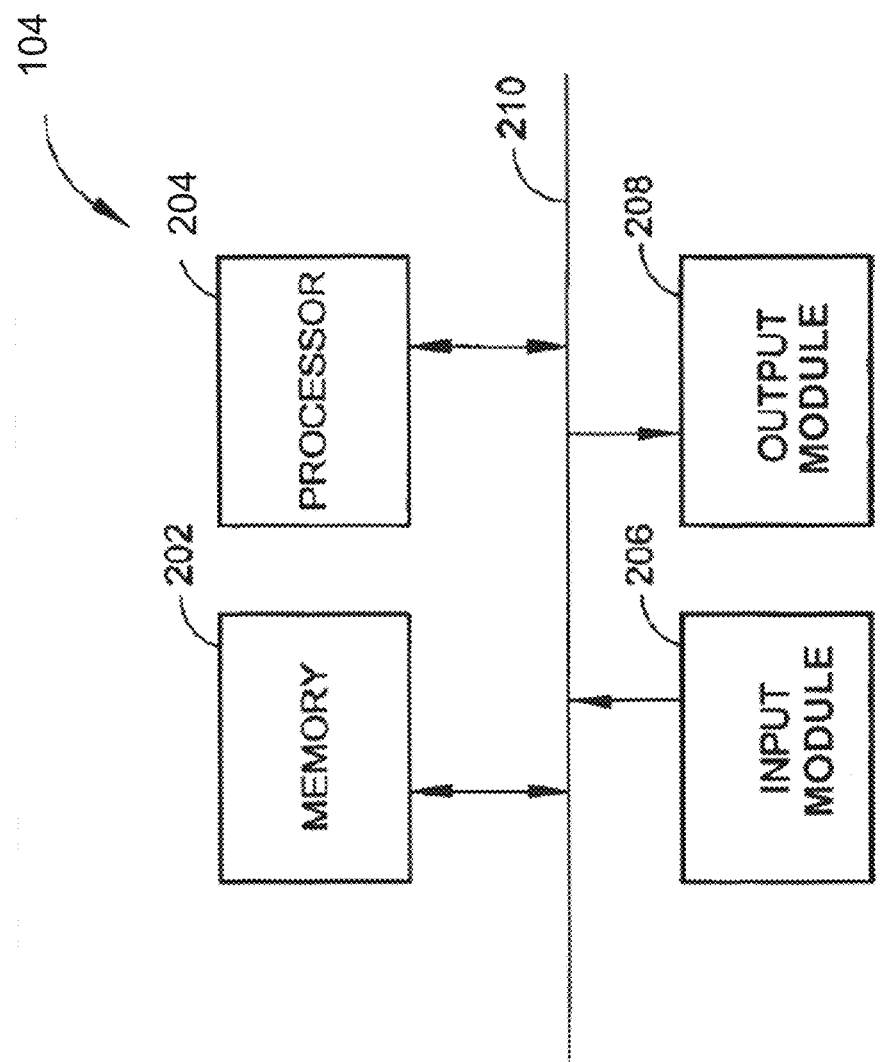
FIG. 2 is a hardware block diagram of an exemplary implementation an embodiment of a controller used in the system of FIG. 1.

FIG. 2 is a hardware block diagram of an exemplary implementation of an embodiment of the controller 104 or, alternatively, of the control block 116. As shown, the controller 104 includes a memory 202, a processor 204, an input module 206, an output module 208 and a bus 210. The memory 202 can be, for example, any type of non-volatile memory device, a random access memory (RAM), a memory buffer, a hard drive, a database, an erasable programmable read-only memory (EPROM), an electrically erasable read-only memory (EEPROM), a read-only memory (ROM) and/or so forth. The memory 202 can store instructions to cause the processor 204 to execute modules, processes and/or functions associated with the controller 104 and/or the control block 116. It is understood that although a single memory 202 is illustrated, the memory 202 may comprise one or more separate memory devices. Generically, the memory 202 may also be referred to as a computer readable medium. In a broad sense, the memory or computer readable medium refers to any type of medium that stores instructions executable by a processor, machine or computer. For example, the memory or computer readable medium may be any type of memory device. In several embodiments, the computer readable medium is a removable medium, such as a flash drive, floppy, hard, compact disc (CD), digital versatile disc (DVD), etc. Furthermore, the programming instructions stored on the memory 202 may be software and/or firmware.

The processor 204 can be a general purpose processor, a Field Programmable Gate Array (FPGA), an Application Specific Integrated Circuit (ASIC), a Digital Signal Processor (DSP), and/or the like. The processor 204 can run and/or execute applications, modules, processes and/or functions associated with the controller 104 and/or the control block 116. According to several embodiments, programming instructions can be provided that are stored on a memory 202 (or a computer readable medium) as a set of instructions to be executed on the processor 204 or other machine. Such instructions allow a user to program or teach an automated actuator control system a motion profile for a specific application. In several embodiments, a motion profile can be a set of register values stored in the memory 202. Once the system is taught a motion profile, the programmed instructions use the stored motion profile to operate the actuator based automated inspection process. Thus, without the motion profile, the programmed instructions are not able to execute an inspection routine of a given component.

Typically, the control system programming instructions are stored as code or a set of instructions in the memory 202. This code is executed or run by the processor 204 to implement the functionality of the code. For example, portions of the programmed instructions are retrieved from memory 202 by the processor 204 and executed using other information stored in memory 202 (e.g., as input by the user) and/or input information received from the input module 206. In use, one or more generated outputs (such as, for example, an actuator control signals, pass/fail signals, etc.) are output via the output 208 module. Referring to FIGS. 1-2, the input module 206 can receive inputs from an input device 106 (shown in FIG. 1), inputs from the master controller 108 (shown in FIG. 1) or inputs in the form of measurements (such as encoder readings) or other feedback from the actuator 102 (shown in FIG. 1). The output module 208 may send outputs to the actuator 102, to the master controller 108 and/or to the input device 106. The output of the input device 106 allows data and instructions from the input device 106 to pass to the controller 104, while the input of the input device 106 receives data and instructions from the controller 104.

In many embodiments, the programmed instructions stored in the memory of the input device (not shown in FIGS. 1-2) can allow the user to enter and store one or more motion profiles corresponding to different components to be inspected by the actuator 102 in cooperation with the programmed instructions stored in the memory 202 of the controller 104 that control the actuator 102. Such programmed instructions stored in the memory 202 of the controller 104 are based on user entered parameters at the input device 106 that are forwarded to the controller 104. In such embodiments, the memory of the input device is used to store multiple motion profiles. In other embodiments, the programmed instructions allow the stored motion profiles to be transferred from the input device 106 to additional controllers 104. Furthermore, in some embodiments, the programmed instructions stored in the memory of the input device allow for motion profiles that are generated elsewhere to be transferred into the input device 106.

One or more of these "core" programming instruction sets can then be transferred from the input device 106 to the controller 104. In one embodiment, a "core" programming instruction set (e.g., implemented as software and/or firmware) can refer to the programming instructions that would be used by a controller 104 to allow a user to program a motion profile as well as to operate the actuator 102, where the core programming instruction set is specific to the type of actuator 102 that is being controlled by the controller 104. For example, a first core programming instruction set is developed that is specific to a controller that controls an x-y actuator, a second core programming instruction set is developed that is specific to a controller that controls a linear and rotary (x and θ) actuator, and a third core programming instruction set is developed that is specific to a controller that controls an x, y, z and rotary actuator. The input device 106 can stores multiple core programming instruction sets that may be selectively transferred into a given controller 104, from, for example, a computer. Typically, the stored motion profile(s) in the memory of the input device (not shown in FIGS. 1-2) and/or the memory 202 as programmed by the user can include a set of registers in memory that each stores the commands and parameters needed for the particular inspection routine and component. Once the control system is taught a motion profile, the programmed instructions can use the stored motion profile to operate the actuator-based automated inspection process.

Figure 3:
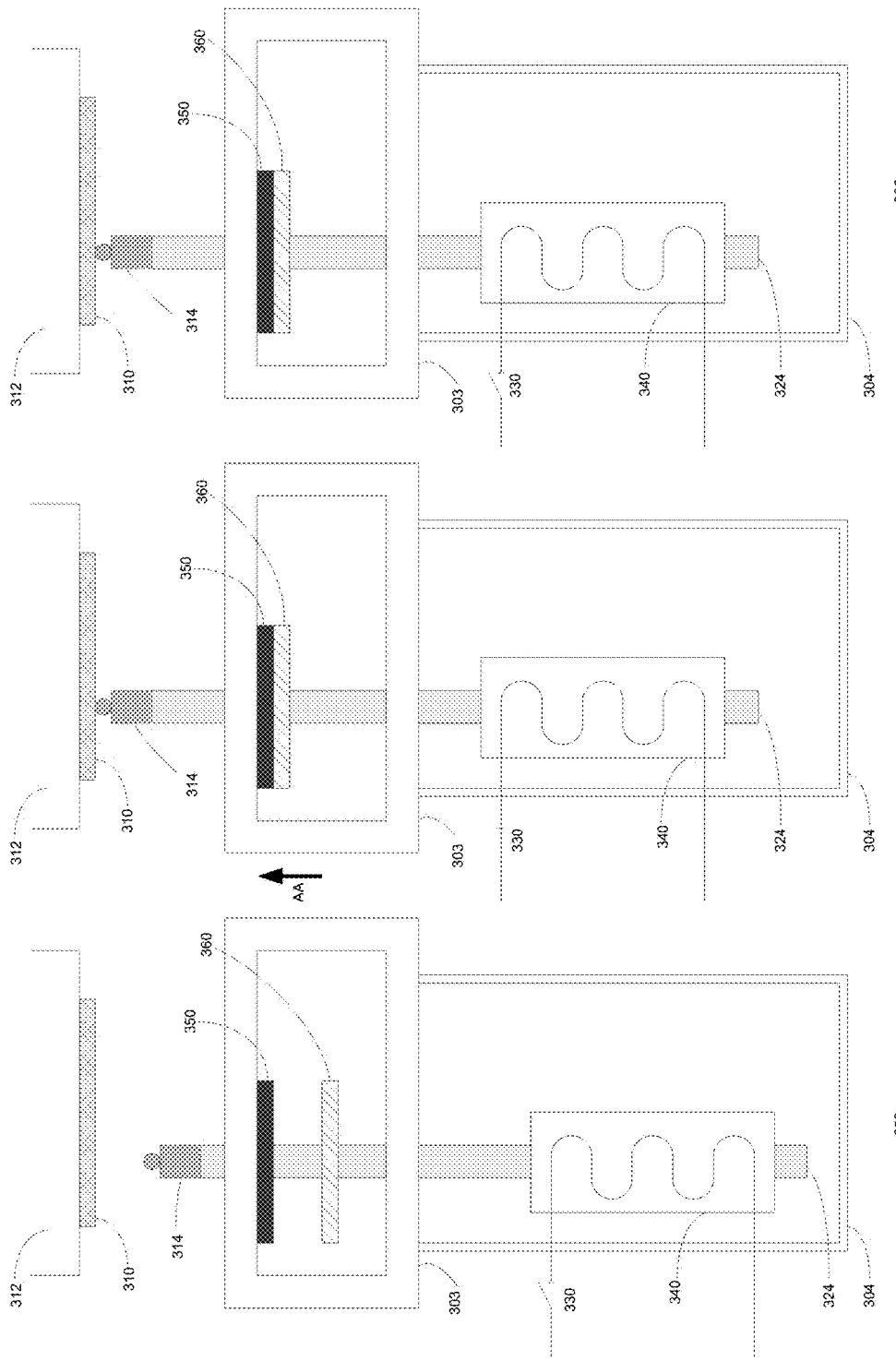
FIGS. 3A-3C show exemplary linear actuators with magnetic latches according to an embodiment of the present invention.

In one embodiment a user may set the input parameters in the input device 106. As described above, the input device 106 can be any device that can allow the user to input the desired actuator parameters such as, for example, test-probe assembly movement profiles, velocities, time delays, measurements and tolerance measurements that are specific to the application. The input device 106 can be, for example, a handheld device (e.g., a handheld pendant), a personal computer, a notebook computer, and/or the like. The input device 106 can be coupled to the controller 104 via, for example, an RS-232, EIA-232, EIA-422 or EIA-485 connection. In other instances, however, the coupling of the input device 106 to the controller 104 can be done via any wired or wireless communication methods to communicate input data to the controller 104. The input parameters can be included in a set of programming instructions that are, for example, programmable by the user to operate an actuator-based component inspection system in an automated fashion. As described above, the input device 106 can include a display unit (not shown in FIGS. 1-3) that can be, for example, an LCD unit or a LED alpha-numeric display unit that displays a GUI generated by the control system that can allow a user to interact with the controller 104. The GUI may include a set of displays having message areas, interactive fields, pop-ups, pull-down lists, notification areas, and buttons operated by user. The GUI may include multiple levels of abstraction including groupings and boundaries. The programming instructions or code (implemented as software and/or firmware) installed on the input device 106 can receive a variety of user input parameters. Such input parameters are typically associated with an automated routine or motion profile for automated execution. As described above, a motion profile can be stored sequential set of test-probe assembly movements and actions (e.g., to cause position measurements) and tolerance values associated with certain measurements that as a whole define the operation of the test-probe assembly and measurements taken during an inspection routine.

The set of input parameters entered by the user in the input device 106 can guide the functioning of the controller 104. The controller 104 can generate control signals that control the operation of the actuator 102. As described above, the controller 104 can be a servo controller that can generate control signals that operate a moving coil actuator 102. For example, in accordance with programmed instructions, typically in the form of software, the controller 104 generates controls signals and outputs those signals to the actuator 102 to cause movement of a test-probe assembly (or test-probe assembly) about one or more axes. In some configurations, the controller 104 can be, for example, a Galil DMC31012 controller with built-in amplifier and a 16 bit analog output.

The actuator 102 is similar to the actuator 102 shown in FIG. 1 and can be a pneumatic, hydraulic or electrical actuator. In the preferred embodiment, the actuator 102 is an electrical actuator, such as a moving coil actuator (also known as a voice coil actuator) or a moving magnet actuator that includes a linear encoder feedback mechanism. The actuator 102 can includes a test-probe assembly 114 that is moveable in at least one axis. For example, depending on the specific actuator used, the test-probe assembly 114 may be moved in an x, y and/or z axis relative to the body of the actuator 102. Furthermore, the test-probe assembly may be rotational (θ) about one or more of the x, y and/or z axes. The actuator 102 includes one or more encoders (not shown) that are capable of taking positional measurements about one or more axes. That is, in response to control signals from the controller 104, the actuator 102 sends measurements from its encoders to the controller 104 to indicate the precise positional location of the test-probe assembly about the relevant axes.

In an exemplary embodiment, the actuator 102 is operatively coupled to a load cell (e.g., load cell can be directly integrated on the shaft of the actuator 102). The load cell is a transducer (or force sensor) that can convert a force into an electrical signal. Such load cells can be, for example, hydraulic load cells, pneumatic load cells, strain-gage load cells, and/or the like. The load cell measures the force exerted by the test-probe assembly of the actuator 102 on a contact surface (i.e., target) about a given axis. The electrical output signal of the load cell is typically in the order of a few millivolts and typically necessitates amplification before it can be used. The output of the load cell can be scaled to calculate the force applied to the load cell as the test-probe assembly approaches the target. In some configurations, the load cell can be, for example, a Futek LSB200 load cell (i.e., force sensor) with a 0.01% accuracy that can operate in the 6000 g force range. The load cell amplifier is an instrumentation amplifier and amplifies the electrical output signal (e.g., a voltage or a current) of the load cell and interfaces with the controller 104 to send the amplified electrical signal to the controller 104. In some instances, the load cell amplifier can include an analog-to-digital converter to convert the analog output of the load cell amplifier to a digital signal before sending the output signal to the controller 104. In some configurations, the load cell amplifier can be, for example, the Futek QIA121 analog amplifier with universal serial bus (USB) connectivity.

Similar to FIG. 1, FIGS. 3A-3C show exemplary linear actuators 302 including test-probe assemblies 314. However, the actuators 302 of FIGS. 3A-3C also include magnetic latches configured to retain the shaft 324 in a fixed position, according to an embodiment of the present invention. In FIGS. 3A-3C, an actuator 302 is positioned below a handler 312. A component 310 is removably coupled to the handler 312 and is shown in a test position above test-probe assembly 314 that is coupled to an end of shaft 324. Magnet 350, together with steel plate 360, forms a magnetic latch. In some embodiments, the magnet 350 is a permanent magnet, and in other embodiments, the magnet 350 is an electromagnet. Magnet 350 can be securely affixed to adapter 303, and adapter 303 can be securely affixed to actuator 302. In some embodiments, the magnet 350 is coupled to the inside or outside of the actuator body or housing 304, and no adapter is required. In other embodiments, the adapter is integrally formed as part of the body or housing 304 of the actuator 302. In other embodiments, the adapter is separated from the actuator 302, and both the actuator and adapter are coupled to a common frame. Steel plate 360 can be adjustably coupled to shaft 324 and can be repositioned as needed to ensure that the test-probe assembly 314 contacts a target surface of component 310 when the magnetic latch is engaged. Moving coil 340 can be securely affixed to shaft 324 and is energized when switch 330 is closed, and de-energized when switch 330 is open. Switch 330 is controlled by a controller (not shown) and the term "switch" refers to any mechanism or device that can be used to selectively pass current to the moving coil 340 of the actuator 302.

Although the embodiments described herein include magnetically-based latch arrangements, it is contemplated that other types of latch arrangements may be suitable for use in certain applications. For example, and interference fit type latch could be used whereby the friction between two interlocking pieces retains the test-probe assembly in place, thereby allowing the moving coil to be de-energized. In another example, the latch could operate based on vacuum or suction forces generated between two surfaces. In another example, a spring-loaded latch could be used, including a strike piece and a catch piece, to retain the shaft of the actuator in a given position. In still another example, adhesive and cohesive forces between two surfaces could be used to retain the shaft of the actuator in given position.

Though described herein as latching the shaft of an actuator in an extended position, in some embodiments the magnetic latch can be configured to latch the shaft of an actuator in a retracted position. In other embodiments, two magnets could be used, with each magnet being positioned on opposite sides of the steel plate and spaced a given distance away from the steel plate. In these embodiments, the shaft of the actuator could be latched in either of two positions.

The magnetic latch maintains the position of the shaft and the test-probe assembly coupled thereto, while allowing the moving coil of the actuator to be de-energized. De-energizing the moving coil prevents overheating, saves electricity, and prevents premature failure of the actuator. The magnetic latch can also function as a failsafe to lock the shaft in a given position in the event that power is cut-off from the actuator.

As show in FIG. 3A, moving coil 340 is not energized as indicated by switch 330 being in an open position. Magnet 350 and steel plate 360 are separated indicating that the magnetic latch is not engaged. Handler 312 has moved component 310 into a ready position so that test-probe assembly 314 can be raised in direction AA to contact component 310. Once moving coil 340 is energized, test-probe assembly 314 rapidly moves in direction AA to an approach position located a safe distance from the surface of component 310. Once the test-probe assembly 314 has been positioned close to the surface of component 310, a soft landing procedure is employed to bring the test-probe assembly 314 in soft contact with the surface of the component 310.

As show in FIG. 3B, concurrent with the test-probe assembly 314 soft contacting with the surface of the component 310, the steel plate 360 contacts with magnet 350 to engage the magnetic latch. Once the magnetic latch engages, switch 330 can be opened and moving coil 340 can be de-energized.

As show in FIG. 3C, the magnetic latch retains test-probe assembly 314 in contact with the surface of component 310 so that prolonged test measurements can be taken over a period of time. In some examples, the magnetic latch retains test-probe assembly 314 in contact with the surface of component 310 for measurement time of about 0.5 seconds, 1.5 seconds, 2.0 seconds, or 2.5 seconds with a contact force of about 1.0 kilogram-force (kg-f), 2.0 kg-f, 3.0 kg-f, 4.0 kg-f, or 5.0 kg-f. In some examples, the measurement time is between 0 and 5 seconds, between 5 and 10 seconds, between 10 and 20 seconds, between 20 and 30 seconds, between 30 and 60 seconds, or greater than 60 seconds and including combinations and sub-combinations of the aforementioned ranges. In some examples, the contact force is between 0 and 1.0 kg-f, between 1.0 and 2.0 kg-f, between 2.0 and 3.0 kg-f, between 3.0 and 4.0 kg-f, between 4.0 and 5.0 kg-f, or greater than 5.0 kg-f and including combinations and sub-combinations of the aforementioned ranges.

In practice, the amount of force required to un-latch the magnetic latch is typically much less than the maximum possible force applied by the magnetic latch. This is because the maximum possible force applied by the magnetic latch can be selected so as to be relatively close to the required contact force, although it must be greater. For example, in the case where 3.0 kg-f is applied to the component to be tested, the maximum magnetic latch force can be selected so that it is limited to 3.2 kg-f. This means the net force needed unlatch the magnetic latch needs only to be greater than 0.2 kg-f. This is useful since the amount of time need to return the actuator shaft to its initial, starting position can be short since the breakaway, unlatching force is low.

Figure 4:
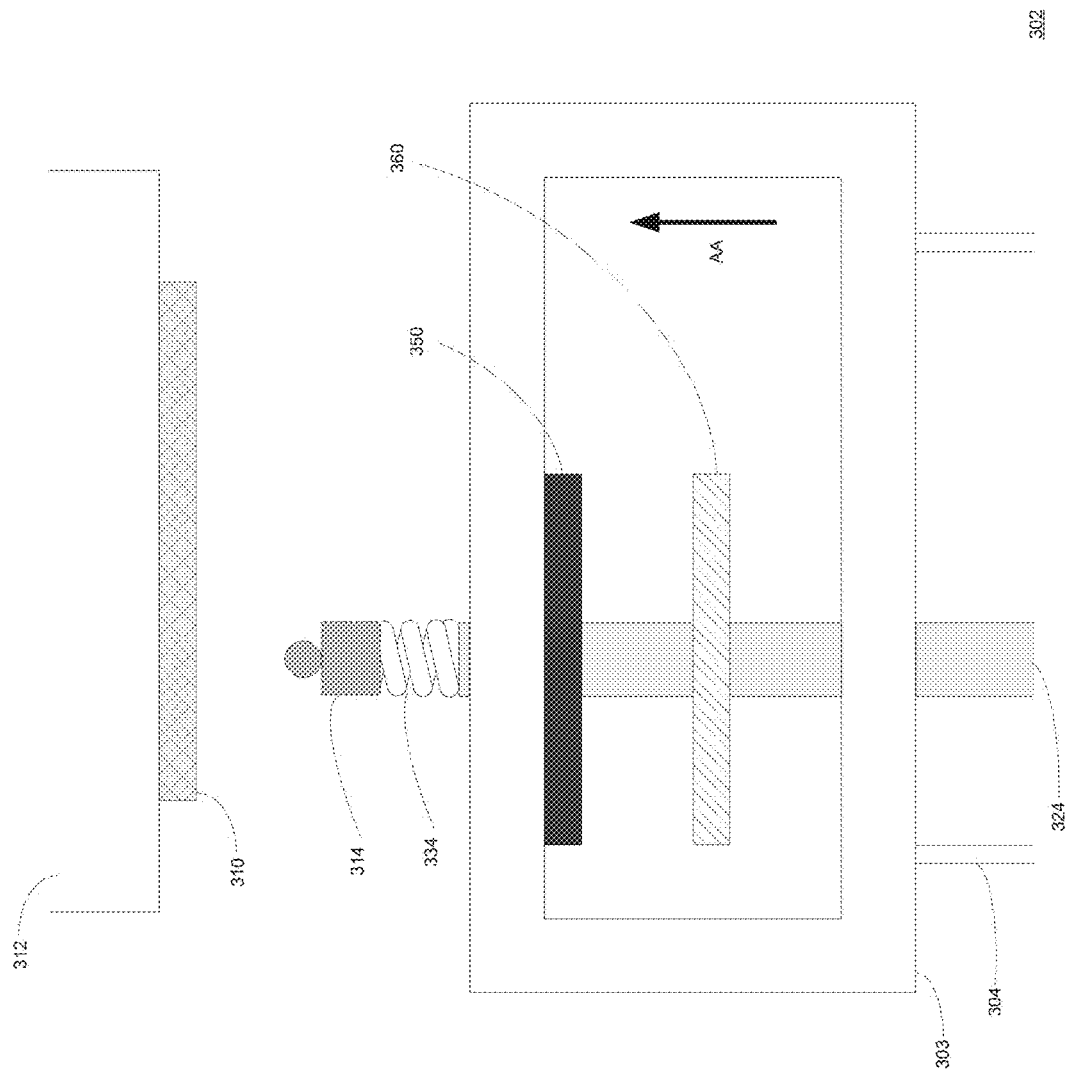
FIG. 4 shows an exemplary linear actuator with a magnetic latch and a resilience mechanism coupled to the test assembly according to an embodiment of the present invention.

FIG. 4 shows a portion of an exemplary linear actuator 302 including a shaft 324 protruding from an end of the housing 304. A moving coil 340 is disposed in the housing 304 and coupled to the shaft 324. Magnet 350, which together with steel plate 360 forms a magnetic latch, is coupled to the shaft 324. An optional resilience mechanism 334 is also coupled to the shaft 324 and to the test-probe assembly 314, according to an embodiment of the present invention. As shown in FIG. 4, the resilience mechanism 334 can be a spring that is designed to compress as the test-probe assembly 314 contacts the target surface of component 310. In some embodiments, the resilience mechanism can be an elastomeric material of a predetermined thickness, an air bag, or other resilient material or system. The resilience mechanism 334 helps to maintain the requisite level of contact force between the test-probe assembly 314 and the surface of component 310 while the magnetic latch assembly is engaged. The resilience mechanism 334 can act as a buffer and help prevent the moving coil from applying too much force against the surface of component 310. The resilience mechanism 334 can also reduce the need to fine tune the position of the adjustable steel plate 360 on the shaft 324 in order to maintain the requisite level of force when the magnetic latch is engaged, and can be used to compensate for distance variations between the retracted test-probe assembly to the surfaces of components. Once the requisite level of force is determined, a resilience mechanism with the designed properties can be selected and coupled between shaft 324 and test-probe assembly 314.

Figure 5:
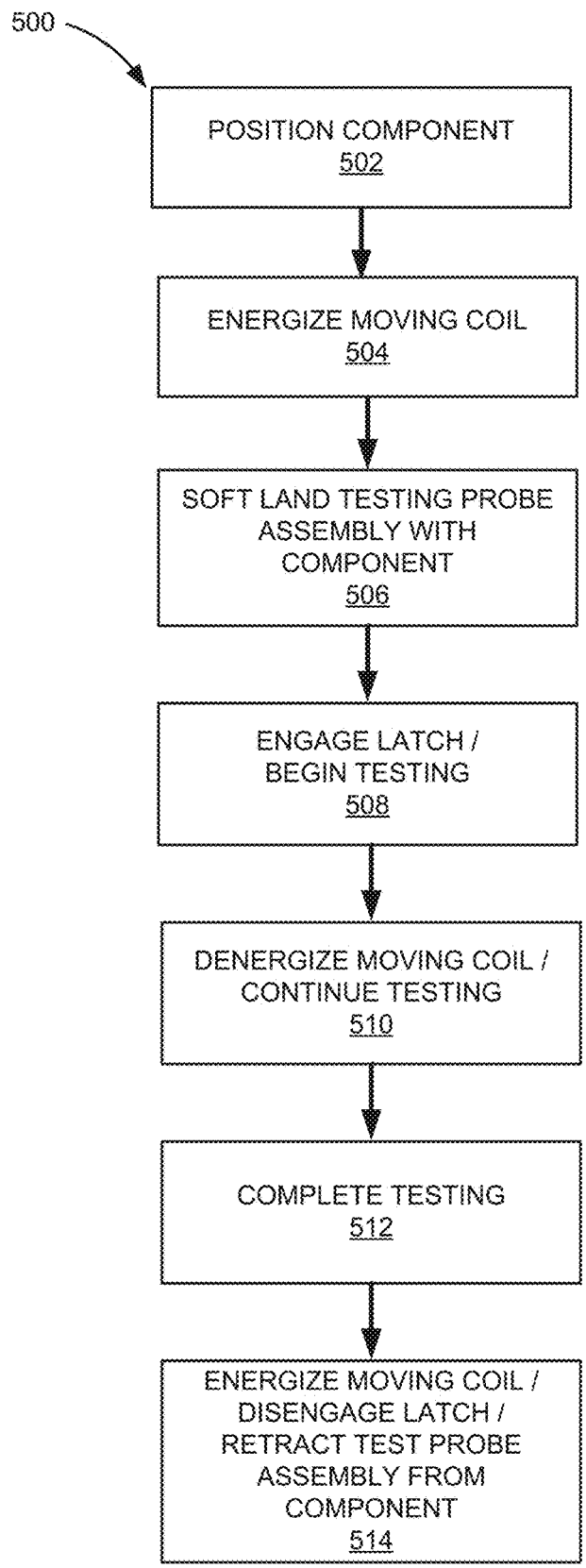
FIG. 5 is a flowchart describing exemplary operation of the actuator apparatus described with reference to FIGS. 3A-3C.

FIG. 5 is a flowchart describing exemplary operation 500 of the actuator apparatus described with reference to FIGS. 3A-3C. In step 502, a handler 312 positions component 502 so it is ready to be tested by test-probe assembly 314. Moving coil 340 is energized causing the test-probe assembly 314 to approach the surface of component 310 in step 504. The controller of the moving coil can be programmed to move the test-probe assembly 314 at a rapid speed until reaching an approach position proximate to the surface of the component 310. In step 506, the test-probe assembly 314 begins a soft land procedure from the approach position to the surface of the component 310. Concurrent with the test-probe assembly 314 contacting the surface of component 310, in step 508 the magnetic latch engages, and the test-probe assembly 314 begins testing of the component 310. The magnetic latch maintains the contact force, typically 3.0 kilograms-force, between the test-probe assembly 314 and the component 310 after the moving coil 340 de-energizes in step 510. The testing and measurements continue for a predetermined duration, typically 1.5 seconds, until the testing is completed in step 512. In step 514, the moving coil 340 is energized to separate magnet 350 from steel plate 360 thereby disengaging the magnetic latch. The test-probe assembly 314 retracts away from the component 310 and the handler 312 repositions component 310 for the next step of the manufacturing and/or testing process.

As used in this specification, a module can be, for example, any assembly and/or set of operatively-coupled electrical components associated with performing a specific function(s), and can include, for example, a memory, a processor, electrical traces, optical connectors, software (that is stored in memory and/or executing in hardware) and/or the like.

As used in this specification, the singular forms "a," "an" and "the" include plural referents unless the context clearly dictates otherwise. Thus, for example, the term "an actuator" is intended to mean a single actuator or a combination of actuators.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but can be implemented using a variety of alternative architectures and configurations. Additionally, although the invention is described above in terms of various embodiments and implementations, it should be understood that the various features and functionality described in one or more of the individual embodiments are not limited in their applicability to the particular embodiment with which they are described, but instead can be applied, alone or in some combination, to one or more of the other embodiments of the invention, whether or not such embodiments are described and whether or not such features are presented as being a part of a described embodiment. Thus the breadth and scope of the present invention should not be limited by any of the above-described embodiments.

Some embodiments described herein, such as for example, the noise reduction methods, relate to a computer storage product with a non-transitory computer-readable medium (also can be referred to as a non-transitory processor-readable medium) having instructions or computer code thereon for performing various computer-implemented operations. The computer-readable medium (or processor-readable medium) is non-transitory in the sense that it does not include transitory propagating signals per se (e.g., a propagating electromagnetic wave carrying information on a transmission medium such as space or a cable). The media and computer code (also can be referred to as code) may be those designed and constructed for the specific purpose or purposes. Examples of non-transitory computer-readable media include, but are not limited to: magnetic storage media such as hard disks, floppy disks, and magnetic tape; optical storage media such as Compact Disc/Digital Video Discs (CD/DVDs), Compact Disc-Read Only Memories (CD-ROMs), and holographic devices; magneto-optical storage media such as optical disks; carrier wave signal processing modules; and hardware devices that are specially configured to store and execute program code, such as Application-Specific Integrated Circuits (ASICs), Programmable Logic Devices (PLDs), Read-Only Memory (ROM) and Random-Access Memory (RAM) devices.

Examples of computer code include, but are not limited to, micro-code or micro-instructions, machine instructions, such as produced by a compiler, code used to produce a web service, and files containing higher-level instructions that are executed by a computer using an interpreter. For example, embodiments may be implemented using imperative programming languages (e.g., C, Fortran, etc.), functional programming languages (Haskell, Erlang, etc.), logical programming languages (e.g., Prolog), object-oriented programming languages (e.g., Java, C++, etc.) or other suitable programming languages and/or development tools. Additional examples of computer code include, but are not limited to, control signals, encrypted code, and compressed code.

While various embodiments have been described above, it should be understood that they have been presented by way of example only, and not limitation. Where methods described above indicate certain events occurring in certain order, the ordering of certain events may be modified. Additionally, certain of the events may be performed concurrently in a parallel process when possible, as well as performed sequentially as described above. Although various modules in the different devices are shown to be located in the processors of the device, they can also be located/stored in the memory of the device (e.g., software modules) and can be accessed and executed by the processors. Accordingly, the specification is intended to embrace all such modifications and variations of the disclosed embodiments that fall within the spirit and scope of the appended claims.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of" will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of" "only one of" or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A method for testing a component using a test-probe assembly coupled to a shaft of an actuator, the method comprising:
    energizing the actuator during a first time period to move the test-probe assembly into an approach position, the approach position being a predetermined distance from a surface of the component;
    energizing the actuator during a second time period by performing a soft landing procedure wherein the performing includes moving the test-probe assembly from the approach position into soft contact with the surface of the component;
    latching the shaft in a fixed position so as to cause the test-probe assembly to apply a constant force to the surface of the component, wherein the latching includes engaging a latch arrangement concurrent with the soft contact;
    de-energizing, subsequent to the engaging the latch arrangement, the actuator while maintaining the shaft in the fixed position for a duration of time, wherein the latch arrangement is configured to apply a maximum force greater than the constant force upon being engaged; and
    energizing the actuator during a third time period to un-latch the latch arrangement and move the test-probe assembly out of contact with the surface of the component, wherein an amount of force required to un-latch the latch arrangement is less than the maximum force.

2. The method of claim 1, further comprising:
    determining that the test-probe assembly has made soft contact with the surface of the component.

3. The method of claim 2, wherein determining that the test-probe assembly has made soft contact with the surface of the component comprises measuring the force applied by the test-probe assembly to the surface component.

4. The method of claim 3, wherein the force applied by the test-probe assembly to the surface of the component is measured with a load cell.

5. The method of claim 1, wherein the actuator includes a moving coil disposed within a housing defining a first interior volume and wherein the latch arrangement is included within an adapter defining a second interior volume different from the first interior volume.

6. The method of claim 1, wherein the latching the shaft in a fixed position includes engaging a magnetic latch of the latch arrangement.

7. The method of claim 6, wherein the amount of force required to un-latch the magnetic latch is greater than 7% of the maximum force and less than the maximum force.

8. The method of claim 1, wherein the duration of time is about 1.5 seconds.

9. The method of claim 8, wherein the force is applied is about 3.0 kg-f.

10. A method for testing a component using a test-probe assembly coupled to a shaft of an actuator, the method comprising:
    energizing the actuator to extend the shaft to move the test-probe assembly into contact with a surface of the component;
    magnetically latching the shaft in a fixed position using a magnetic latch in order to cause the test-probe assembly to apply a constant force to the surface of the component;
    de-energizing the actuator while maintaining the shaft in the fixed position, wherein a maximum force applied by the magnetic latch is greater than the constant force; and
    energizing the actuator to un-latch the magnetic latch and move the test-probe assembly out of contact with the surface of the component, wherein an amount of force required to un-latch the magnetic latch is less than the maximum force.

11. The method of claim 10 wherein the amount of force is less than 10% of the maximum force.

12. The method of claim 10, further comprising:
    measuring the force applied by the test-probe assembly to the surface of the component.

13. The method of claim 10, wherein the actuator includes a moving coil disposed within a housing defining a first interior volume and wherein the magnetic latch is included within an adapter defining a second interior volume different from the first interior volume.

14. An apparatus comprising:
a linear actuator including a housing defining a first interior volume, a shaft protruding from an end of the housing, and a moving coil disposed in the first interior volume and coupled to the shaft;
an adapter coupled to an end of the housing of the linear actuator, the adapter defining a second interior volume different from the first interior volume and configured to allow the shaft to extend and to retract therethrough;
a ferrous plate disposed in the second interior volume, the ferrous plate being adjustably coupled to the shaft;
a magnet coupled to the adapter, wherein the magnet is disposed in the second interior volume and is configured to engage with the ferrous plate when the shaft is extended from the housing of the linear actuator so as to retain the shaft in a fixed position.

15. The apparatus of claim 14, further comprising:
a test-probe assembly coupled to an end of the shaft.

16. The apparatus of claim 15, further comprising:
a resilience mechanism coupled to the shaft, the resilience mechanism configured to maintain a constant force when the test-probe assembly is in contact with a surface of a component.

17. The apparatus of claim 16, wherein the resilience mechanism is interposed between the end of the shaft and the test-probe assembly.

18. The apparatus of claim 16, wherein the resilience mechanism comprises a spring.

19. The apparatus of claim 16, wherein the resilience mechanism comprises an elastomeric material.

20. The apparatus of claim 14, wherein the test-probe assembly includes a load cell.

\* \* \* \* \*